US006442731B2

United States Patent
Doi

(10) Patent No.: US 6,442,731 B2
(45) Date of Patent: *Aug. 27, 2002

(54) INTERACTIVE METHOD OF OPTIMUM LSI LAYOUT INCLUDING CONSIDERING LSI CHIP SIZE, TEST ELEMENT GROUPS, AND ALIGNMENT MARKS

(75) Inventor: Tetsuya Doi, Tokyo (JP)

(73) Assignee: Oki Electric Industry Co, LTD, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/072,749

(22) Filed: May 6, 1998

(30) Foreign Application Priority Data

May 26, 1997 (JP) ............................................. 9-153016

(51) Int. Cl.[7] ................................................ B06F 17/50
(52) U.S. Cl. ............................................. 716/1; 716/19
(58) Field of Search ........................................ 716/1, 19

(56) References Cited

U.S. PATENT DOCUMENTS

| | | | | |
|---|---|---|---|---|
| 4,918,614 A | * | 4/1990 | Modarres et al. | 716/10 |
| 5,504,431 A | * | 4/1996 | Maeda et al. | 324/501 |
| 5,532,934 A | * | 7/1996 | Rostoker | 716/10 |
| 5,933,350 A | * | 8/1999 | Fujimoto et al. | 364/468.28 |

OTHER PUBLICATIONS

Koren et al., The Impact of Floorplanning on the Yield of Fault–Tolerant ICs, International Conference on Wafer Scale Integration, pp. 329–338, Jan. 1995.*
C. Ouyang et al., Maximizing Wafer Productivity Through Layout Optimizations, International Conference on VLSI Design, pp. 192–197, Jan. 2000.*
W. Maly, Computer–Aided Design for VLSI Circuit Manufacturability, IEEE Proceedings, pp. 356–392, Feb. 1990.*
R. Frankel et al., Slash–An RVLSI CAD System, International Conference on Wafer Scale Integration, pp. 31–37, Jan. 1989.*
A.J. Strojwas, Design for Manufacturability and Yield, Proceedings of the 1989 26th ACM/IEEE Conference on Design Automation, pp. 454–459, Aug. 1989.*
Z. Koren et al., Does the Floorplan of a Chip affect Its Yield, IEEE International Workshop on Defect and Fault Tolerance in VLSI Systems, pp. 159–166, Oct. 1993.*
Z. Koren et al., The Impact of Floorplanning on the Yield of Fault–Tolerant ICs, IEEE International Conference on Wafer Scale Integration, pp. 329–338, Jan. 1995.*
Kubota et al., An Integrated Database System for Effective Correlation Analysis to Improve LSI Manufacturing Yield, IEEE/CHMT International Manufacturing Technology Symposium, pp. 91–96, Oct. 1993.*
Koren et al., On the Effect of Floorplanning on the Yield of Large Area Integrated Circuits, IEEE Transactions on VLSI Systems, pp. 3–14, Jan. 1995.*

* cited by examiner

Primary Examiner—Matthew Smith
Assistant Examiner—A. M. Thompson
(74) Attorney, Agent, or Firm—Rabin & Berdo, P.C.

(57) ABSTRACT

A method of designing an LSI layout at a stage of making an LSI layout plan for each of a plurality of LSI chips before entering into the design of masks, which includes judging whether or not all the LSI chips can be arranged on a single wafer along with other (nonelectronic) components, based on a given LSI chip size and referring to the information on the other components. An LSI an LSI chip yield per water and/or a manufacturing cost per LSI chip are calculated, whereby an LSI layout designer can quickly and easily, within a limited LSI development term, determine how much the LSI chip size can be downsized for economical production of the LSI chip, referring to the results of the above judgment and calculation.

23 Claims, 4 Drawing Sheets

INTERACTIVE METHOD OF OPTIMUM LSI LAYOUT INCLUDING CONSIDERING LSI CHIP SIZE, TEST ELEMENT GROUPS, AND ALIGNMENT MARKS

BACKGROUND OF THE INVENTION

This invention relates to a method of designing an LSI layout, and more particularly to a method of designing an LSI layout, which makes it possible to achieve an LSI layout which is optimum from the perspective of LSI chip yield per wafer (the number of LSI chips which can be arranged on a single wafer) and manufacturing cost per LSI chip.

Generally, in the initial stage of setting up an LSI layout on a wafer, a so-called floor plan is made at first. The object of this floor plan is to elaborate how to reduce the area occupied by respective LSI chips and also how to improve the performance thereof, thereby roughly setting up the arrangement of LSI chips on the wafer in advance of actually arranging LSI chips and wires distributed thereto on the wafer.

The conventional basic way of thinking about the floor plan has stood on the premise that a reduction of an individual LSI chip size should naturally result in an increase in the number of LSI chips which can be arranged on a single wafer. However, in actual LSI chip production, the number of LSI chips which can be arranged on a single wafer depends not only on the size of the LSI chips, but also on other factors and conditions, for instance the location of various alignment marks which are formed on the wafer and referred to when executing over-printing of various mask patterns by using a light exposure device or an aligner, the placement of one or more Test Element Groups (TEGs) to be mounted on each of the LSI chips for evaluation of respective circuits and processes, and so forth. Therefore, a reduction of the chip size will not necessarily always result in an increase in the number of chips which can be arranged on each wafer, i.e. the LSI chip yield per wafer. Accordingly, even though a reduction of the LSI chip size could be accomplished by expending a huge number of man-hours on the LSI layout design, it might happen that the LSI chip yield will be left unchanged after all, or that the LSI chip yield is decreased contrary to expectations, because of restrictions on the aligner that can be used, restrictions on the location of various alignment marks and the TEG(s), and other restrictions. This has raised a problem to be solved.

Also, with the prior art method, there has sometimes occurred such a case during design work on the mask for a new LSI, after once completing the LSI layout, that various marks and TEG(s) cannot be located on the mask. In the worst such case, the LSI layout cannot but be revised, which results in a large extension of the time period required for development of the new LSI.

As mentioned above, in the prior art method of designing an LSI layout, the design is carried out focusing only on the LSI chip itself, and the arrangement of LSI chips in association with the mask is omitted from consideration, so that a reduction of the LSI chip size fails to result in a reduction of the manufacturing cost, or during the design work for masks after completion of the LSI layout, an LSI chip arrangement satisfying a target LSI chip yield per wafer cannot be realized. Such results have been raised as problems to be obviated.

Accordingly, the present invention has been made in view of the above-mentioned problems involved in the prior art method of designing an LSI layout, and an object of the invention is to provide a novel and improved method of designing an LSI layout which makes it possible to determine, at the stage of designing the LSI layout, how much the LSI chip size is to be reduced in order to realize an optimum LSI layout with respect to the LSI chip yield per wafer and the manufacturing cost per LSI chip.

Another object of the invention is to provide a novel and improved method of designing an LSI layout which makes it possible to determine at the stage of designing the LSI layout, whether or not LSI chips can be arranged on the wafer, thereby eliminating the step of modifying the LSI layout which might be required depending on the results obtained at the mask design stage.

SUMMARY OF THE INVENTION

In order to solve the problems mentioned above, the present invention provides a method of designing an LSI layout which is used at the stage of making an LSI layout plan for each of a plurality of LSI chips before entering into the design of the masks, and which includes a step of judging whether or not all the LSI chips can be arranged on a single wafer along with other (nonelectronic) components (i.e., those which are to be arranged with LSI chips on the same wafer such as TEGs and alignment marks), based on a given LSI chip size and referring to information regarding these other components.

According to the constitution of the above method, it becomes possible, in the LSI layout work before designing the mask, to judge whether or not the LSI layout can be actually realized, based on the currently given LSI chip size. Therefore, this eliminates the step of modifying the LSI layout which might be caused depending on the mask design.

Furthermore, in judging the possibility of arranging the LSI chips and other components on the wafer, it is preferable to take account of the information on these components other than the LSI chip, such as the information on various marks, the information on the TEG(s), and so forth.

In order to solve the problems mentioned above, the present invention still provides a method of designing an LSI layout which is used during the stage of making an LSI layout plan for each of a plurality of LSI chips before entering the stage of designing the masks, wherein there are included steps of calculating an LSI chip yield per wafer based on the given LSI chip size, and/or a step of calculating a manufacturing cost per LSI chip based on the given LSI chip size.

According to the constitution of the above-mentioned method, it becomes possible, during the LSI layout work, to take account of the LSI chip yield per wafer and/or the manufacturing cost per LSI chip, so that it can be judged what LSI chip size is optimum for low cost manufacturing of the LSI chips. Therefore, this contributes to an enhancement of the efficiency in the development of the LSI.

A given LSI chip size used as the basis for a judgment in the method according to the invention, may be a temporary (provisional) LSI chip size which is calculated based on the basic design data, or may be a later stage LSI chip size, employed at a stage after the arranging and wiring of all the LSI chips and other (nonelectronic) components on the wafer have been completed.

Furthermore, as the method of the invention can be applied in such a manner that a plurality of LSI chip sizes may be given, it becomes possible to judge the possibility of arranging all the LSI chips and other components on one wafer for each LSI chip size. If the method is applied such that the LSI chip yield per wafer or the manufacturing cost per LSI chip is calculated with regard to each LSI chip size, the designer may determine which LSI chip size is optimum for the LSI layout.

The aforementioned objects, features and advantages of the invention will become more clear from the following detailed description of the invention, taken in conjunction with the accompanying drawings.

DETAILED DESCRIPTION OF THE INVENTION

Preferred embodiments of the method of designing an LSI layout according to the invention will now be described in detail referring to the accompanying drawings.

Figure 1:
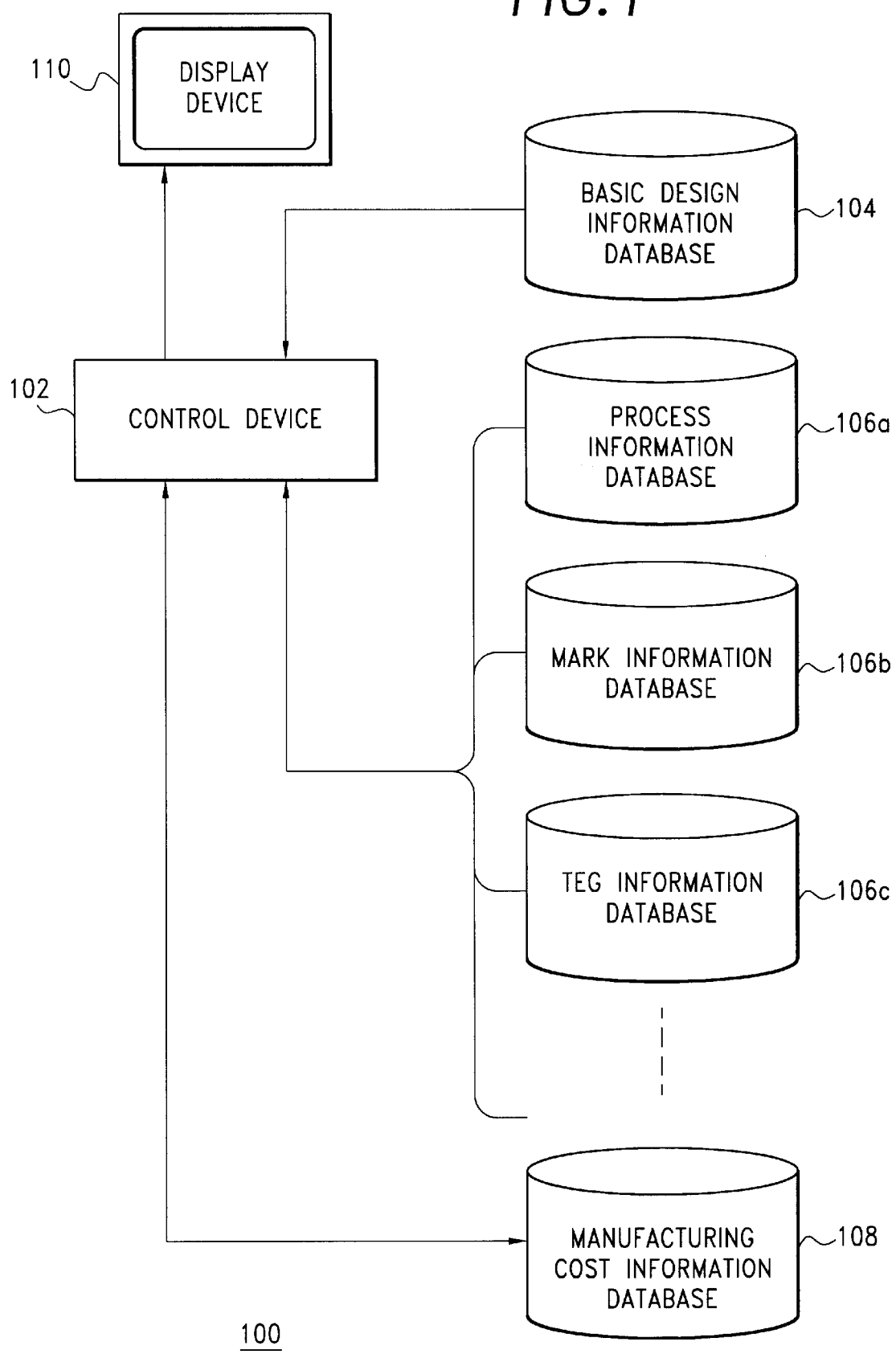
FIG. 1 is a block diagram schematically illustrating a CAD device to which a method of designing an LSI layout according to the invention, is applicable.

Referring to FIG. 1, there will be first described a CAD device 100 which is used for making a floor plan for executing the method of designing an LSI layout according to the invention. A control device 102 collects necessary information from a variety of databases 104, 106a, 106b, 106c . . . 108, and performs necessary operations based on the collected information according to the instruction by an LSI layout designer, and finally reports a result of the operation to the designer in the form of a display on a display device 110 such as a CRT. This report includes the LSI layout and other necessary information, such as an LSI chip yield per wafer and a manufacturing cost per LSI chip. The designer then begins the next step with reference to the displayed information. The above-mentioned constituents of the CAD system 100 include only those most essential for a CAD device for use in the floor plan. Accordingly, it is naturally allowed to additionally employ various peripheral equipment, in order to set up a more practical system.

The LSI layout designer refers to and uses various databases when he designs an LSI layout. To describe the data bases in terms of the example shown in FIG. 1 for instance, he uses the basic design information database 104 which stores data relating to various design elements necessary for designing the LSI layout, the process information database 106a which stores data relating to various process conditions necessary for actual LSI production, the mark information database 106b which stores data relating to various alignment marks to be referred to by an aligner in the lithographic process, the TEG information database 106c which stores the information about the TEG or various TEGs for evaluating the characteristics of circuits and processes, and the manufacturing cost information database 108 storing the information on the manufacturing cost. However, these are merely examples of databases, and in the actual design work, the designer may refers to more various databases other than the mentioned above, for instance an aligner information database.
(First Preferred Embodiment)

Figure 2:
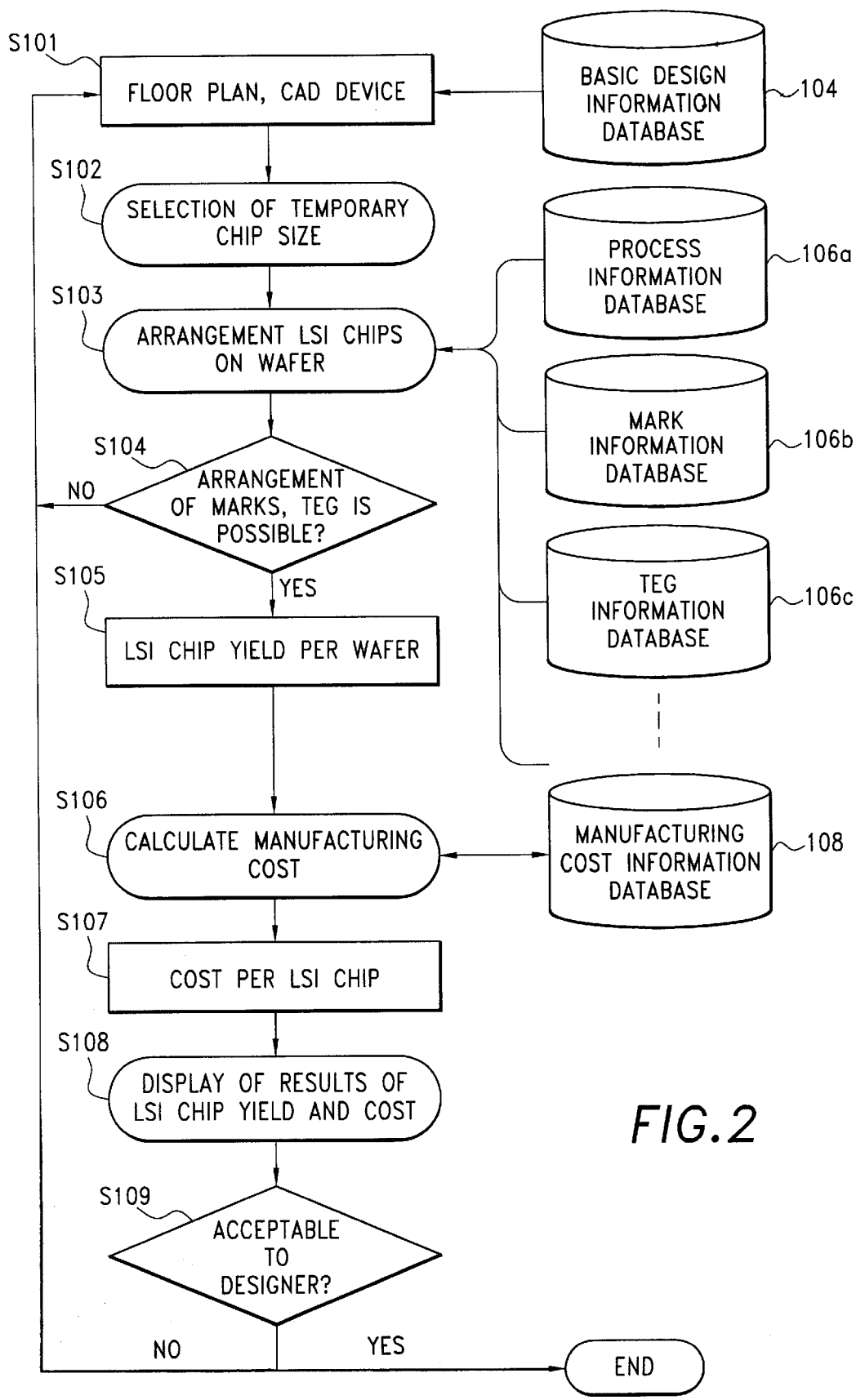
FIG. 2 is a flow chart showing steps of executing a first preferred embodiment of a method of designing an LSI layout according to the invention.

A first preferred embodiment of the invention will now be described in the following with reference to FIG. 2. With the description of this embodiment, it will be made clear how the LSI floor plan is established by referring to an LSI chip yield per wafer and a manufacturing cost per LSI chip, which are calculated by using the CAD device shown in FIG. 1.

After activating the CAD device for use in the floor planning work (step S101), a temporary (provisional) LSI chip size for the floor plan is selected from the basic design information database 104 provided in the CAD device (step S102). The control device 102 then refers to the process information, the mark information, the TEG information, etc., stored in the databases 106a, 106b, 160c, . . . , etc., based on the above provisional LSI chip size, and executes a simulation of LSI layout on the wafer under the same condition as in the actual LSI chip production, namely by arranging on the wafer not only LSI chips but also other components such as various marks, TEG(s), etc. (step S103).

At this stage, the control device 102 judges whether or not all the constituents including LSI chips, various marks, the TEG(s), etc., can be arranged on the wafer under the conditions instructed by the designer (step S104). If it is judged that all the constituents cannot be arranged on the wafer, the control device 102 informs the designer through the display device 110 that the arrangement is not possible under his instructed conditions, and returns to the step S101. Taking this result into account, the designer revises his initially selected conditions, provides a new selection of conditions, and again tries to perform another simulation of the LSI layout under the new conditions, to examine whether or not all the constituents can be arranged on the wafer as intended.

On the contrary, if it is judged at step S104 that all of the constituents, including LSI chips, various marks, TEG(s), etc., can be successfully arranged on the wafer, the control device 102 then calculates an LSI chip yield per wafer from the number of LSI chips located on the wafer (step S105). The control device 102 further refers to the manufacturing cost information stored in the manufacturing cost information database 108, and calculates a manufacturing cost under the current conditions (step S106), and further calculates a manufacturing cost per LSI chip (step S107). The information on the LSI chip yield per wafer and the manufacturing cost per LSI chip obtained in this way, is disclosed to the designer through the display device 101 (step S108). If the result of the above simulation is acceptable in view of the manufacturing cost (YES from step S109), the designer may terminate his LSI floor plan. If, however, the result is still not acceptable in view of the manufacturing cost (NO from step S109), the designer returns to the step S101, revises various design conditions, and again perform the simulation with regard to the arrangement of LSI chips and other various constituents on the wafer.

As described above, according to the first embodiment of the method of designing an LSI layout according to the invention, the designer is able to grasp the LSI chip yield per wafer and the manufacturing cost per LSI chip in connection with his selected chip size, substantially on a real time basis during the stage of working on the LSI layout, prior to entering into the mask design process. Accordingly, the designer may judge with ease how much the LSI chip is to be downsized for an efficient LSI layout.
(Second Preferred Embodiment)

Figure 3:
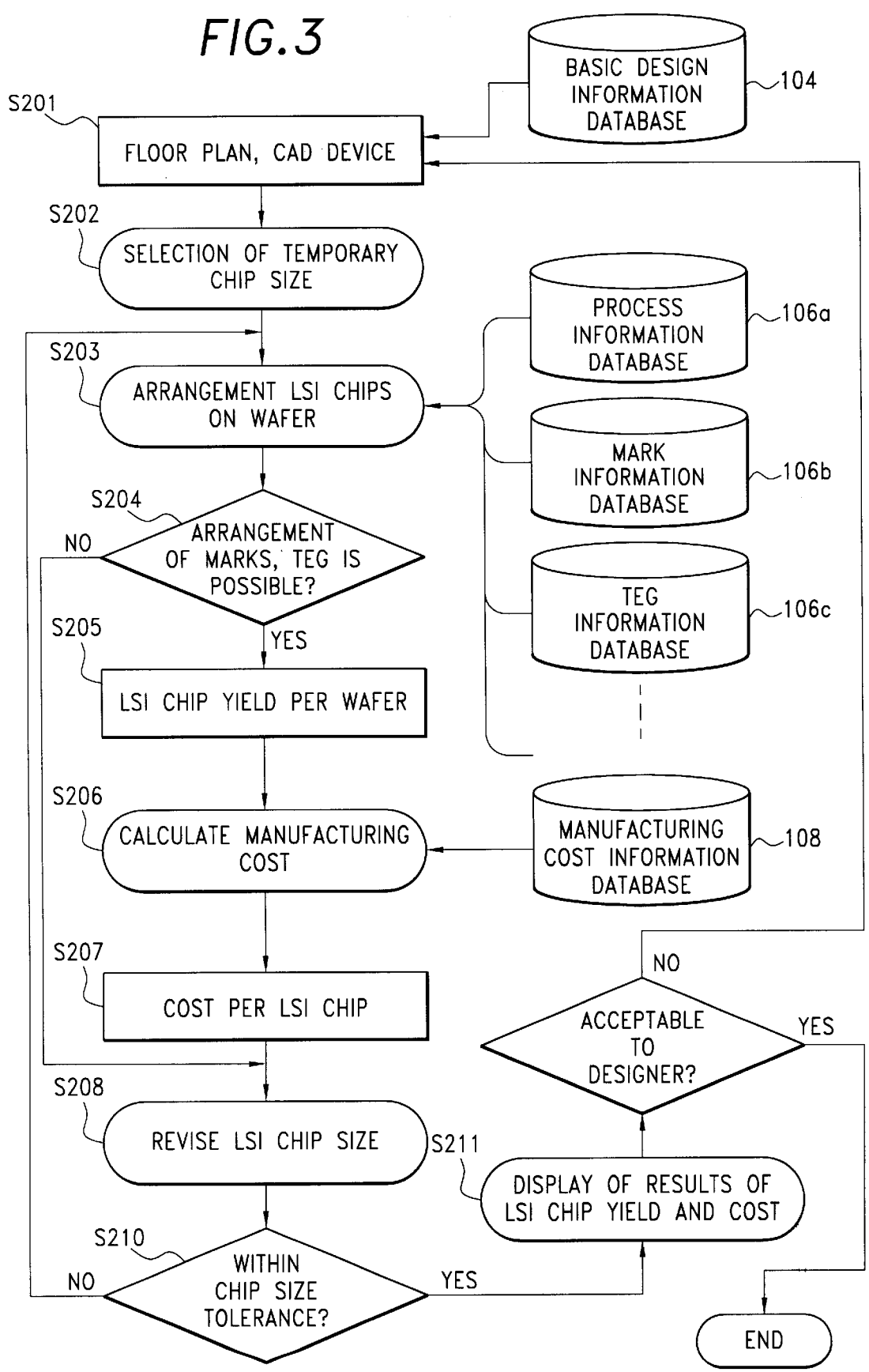
FIG. 3 is a flow chart showing steps of executing a second preferred embodiment of a method of designing an LSI layout according to the invention.

A second preferred embodiment of the invention is now described with reference to FIG. 3. This embodiment relates to how the LSI floor plan is established where the LSI chip size is changed at the stage of making the floor plan, by referring to the LSI chip yield per wafer and the manufacturing cost per LSI chip, which are calculated by means of the CAD device shown in FIG. 1.

At first, the CAD device for use in the floor planning work is activated (step S201). Then, a provisional LSI chip size for the floor plan is selected from the basic design information database 104 provided in the CAD device (step S202). Then, the control device 102 refers to the process information, the mark information, the TEG information, etc., as stored in the databases 106a, 106b, 106c, ..., etc., based on the above provisional LSI chip size, and executes a simulation of the LSI layout on the wafer under the same conditions as in the actual LSI chip production, namely, by arranging on the wafer not only LSI chips but also other provisional components such as various marks, TEG(s), etc. (step S203).

In the next step, the control device 102 judges whether or not all the constituents including LSI chips, various marks, TEG(s), etc., can be arranged on the wafer under the conditions set by the designer (step S204). If it is judged that all the constituents cannot be located on the wafer, the control device 102 calculates neither the LSI chip yield per wafer nor the manufacturing cost per LSI chip with regard to the provisional chip size as selected at that time, and just skips over such calculation steps to the LSI chip size in step S208.

To the contrary, if it is judged at step S204 that all the constituents, including LSI chips, various marks, TEG(s), etc., can be successfully arranged on the wafer, the control device 102 calculates an LSI chip yield per wafer (step S205). The control device 102 further refers to the manufacturing cost information stored in the manufacturing cost information database 108, and calculates a manufacturing cost under the current conditions (step S206) and further calculates a manufacturing cost per LSI chip (step S207).

Then, the control device 102 revises the provisional LSI chip size (step S208) according to the designer's designated conditions. Change of the chip size may be carried out in various ways, for instance changing the chip size (a) by keeping the lateral chip side length constant, (b) by keeping the vertical chip side length constant, (c) by keeping the chip area constant, or (d) by keeping a ratio between the lateral chip side length and the vertical one constant.

Then, it is examined whether or not the revised chip size falls within a tolerable chip size range as designated by the designer (step S210). If the revised chip size falls within the tolerable chip size range, it is disclosed to the designer through the display 110 along with the LSI chip yield per wafer and the manufacturing cost per chip, which are calculated in association therewith, in step 211. To the contrary, if the revised LSI chip size does not fall within the tolerable chip size range, steps S203 through S208 are repeated until the revised LSI chip size falls within the above tolerable range. Through the above procedure, the designer finally selects an optimum chip size and terminates his LSI floor plan.

As described in the above, according to the second embodiment of the invention, in the stage of making the LSI floor plan, calculations of LSI chip yields per wafer and the manufacturing costs per chip can be simulated with different chip sizes, and the results of the simulations are disclosed to the designer so that the designer can select with ease an optimum LSI chip size, which provides the best yield and cost.

(Third Preferred Embodiment)

Figure 4:
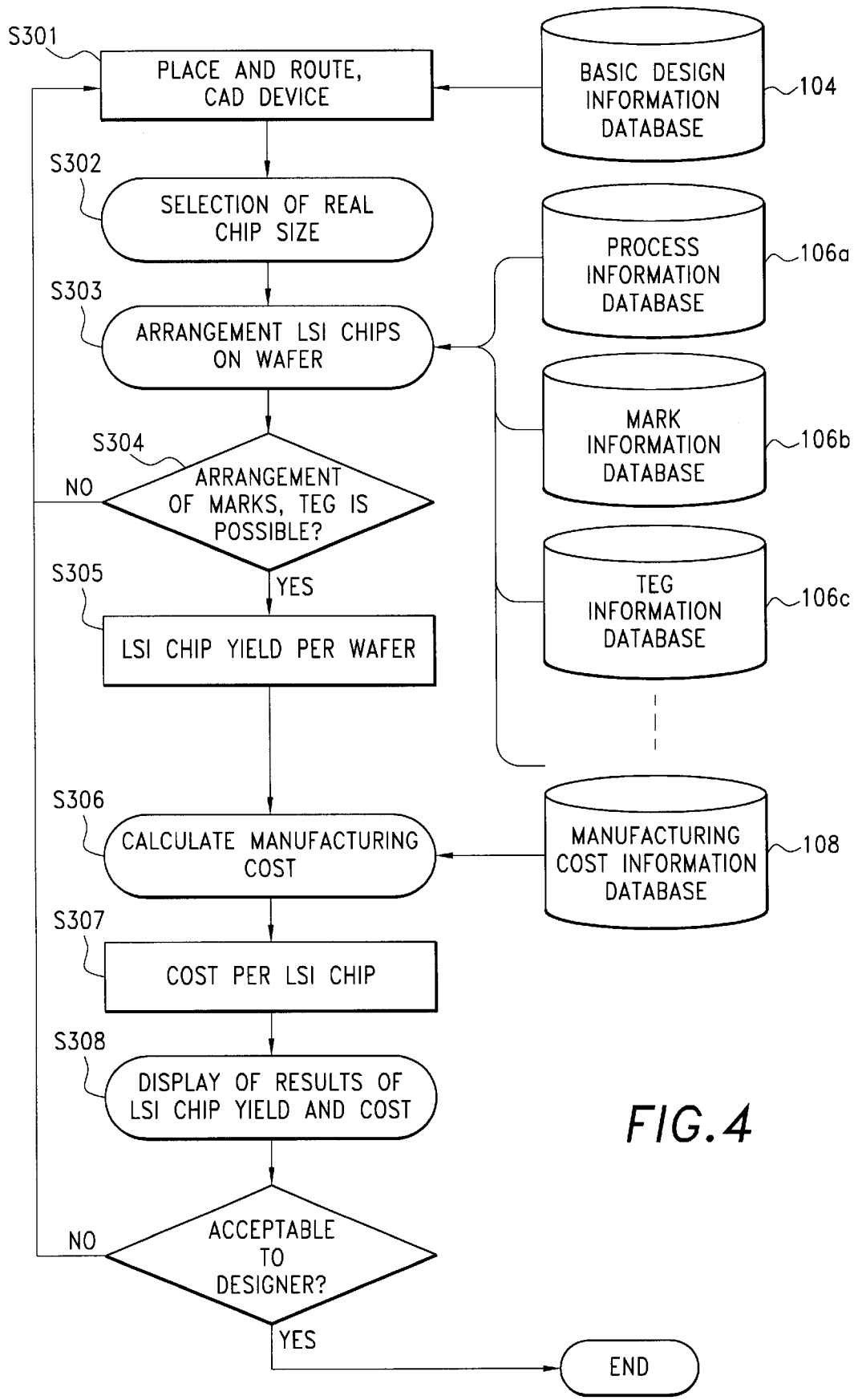
FIG. 4 is a flow chart showing steps of executing a third preferred embodiment of a method of designing an LSI layout according to the invention.

The third embodiment of the method of designing an LSI layout according to the present invention is now described with reference to FIG. 4. With the method of this embodiment, even after completion of an entire arrangement, including I/O cells and wiring, it becomes possible to examine whether or not a targeted LSI chip yield has been achieved.

The CAD device for use in the place and route work (layout work equivalent to the floor plan stage of the prior embodiments) is activated first (step S301). Then, a working LSI chip size after arrangement of LSI chips, other components, and wiring, is selected from the basic design information database 104 provided in the CAD device (step S302). Next, the control device 102 refers to the process information, the mark information, the TEG information, etc., as stored in the databases 106a, 106b, 106c, ..., etc., based on the above working LSI chip size, and executes a simulation of the LSI layout on the wafer under the same conditions as in actual LSI chip production, namely, by arranging on the wafer not only LSI chips but also other components such as various marks, TEG(s), etc. (step S303).

At this stage, the control device 102 judges whether or not all the constituents, including LSI chips, various marks, TEG(s), etc., can be arranged on the wafer according to the conditions given by the designer (step S304). If it is judged that all the constituents cannot be arranged on the wafer, the control device 102 informs the designer through the display device 100 that the arrangement is not possible under his given conditions, and returns to the step S301. Taking account of this result, the designer revises the initial given conditions to select new conditions, and again tries to perform another simulation of the LSI layout under the new conditions, to examine whether or not all the constituents can be arranged on the wafer.

To the contrary, if it is judged at step S304 that all the constituents, including LSI chips, various marks, TEG(s), etc., actually can be arranged on the wafer, the control device 102 calculates an LSI chip yield per wafer from the number of LSI chips arranged on the wafer (step S305). The control device 102 further refers to the necessary manufacturing cost information stored in the manufacturing cost information database 108, and calculates a manufacturing cost under the currently set conditions (step S306), and further calculates a manufacturing cost per LSI chip (step S307). The information on the LSI chip yield per wafer and the manufacturing cost per LSI chip obtained in this way, is disclosed to the designer through the display device 110 (step S308). If the result of the above simulation is acceptable (YES from step S309), the designer may terminate his LSI place and route (layout work). If, however, the result is still not acceptable (NO from step S309), the designer returns to step S301, revises various design conditions, and again executes the simulation with regard to the arrangement of LSI chips and other various constituents on the wafer.

As described in the above, according to the third embodiment of the method of designing an LSI layout according to the invention, even after finishing the design of the entire arrangement, including I/O cells and wiring, the designer can grasp on a real time basis, the possibilities of chip arrangement on the wafer, the LSI chip yield per wafer, and the manufacturing cost per LSI chip in correspondence with the current working chip size, during his work on the LSI layout.

The invention has been described so far by way of several preferred embodiments of the method of designing an LSI layout according to the invention. However, it should be noted that the invention is not limited by those embodiments, and it is clear that anyone skilled in the art may make various changes and/or modifications of the invention without departing from the spirit of the invention as recited in the patent claims attached hereto, and needless to say, such changes and modifications fall within the scope of the present invention.

As has been described, according to the invention, it is made possible, even when the design of the LSI layout is going on, to examine whether or not LSI chips can be arranged on the wafer together with various marks, TEG(s), etc., with the currently selected chip size, so that it is possible to obviate the work to usually required to modify the LSI layout at the time that the mask design is required.

Furthermore, according to the invention, it is possible to obtain the information on the LSI chip yield per wafer and the manufacturing cost per chip in correspondence with the currently selected chip size, even when the design of the LSI layout is going on. Therefore, the invention makes it possible to quickly judge, under the limitation of the LSI development term, how much the LSI chip is to be downsized for an optimum LSI layout, and also to carry out a cost conscious design of the LSI layout.

The entire disclosure of Japanese Patent Application No. H9-153016 filed on May 26, 1997 including specification, claims, drawings and summary is incorporated herein by reference in its entirety.

What is claimed is:

1. A method of manufacturing a plurality of LSI chips on a single wafer, said method including:
   setting a size of one of said LSI chips;
   simulating a layout of said plurality of LSI chips and other components on said single wafer based on the set size of said one of said LSI chips and information regarding said other components, wherein said other components include a production component for use during LSI chip production and having no function for operation of a finished LSI chip;
   judging whether the simulated layout of said plurality of LSI chips and other components fits on said single wafer;
   calculating manufacturing data for said single wafer if the simulated layout of said plurality of said LSI chips and said other components is judged to fit on said single wafer;
   judging by a designer whether the calculated manufacturing data satisfies predetermined acceptable manufacturing data values of the designer; and
   designing a mask for said plurality of LSI chips and said other components on said single wafer if the calculated manufacturing data are judged to satisfy the predetermined acceptable manufacturing data values,
   wherein said plurality of LSI chips are manufactured for use in accordance with the designed mask, and
   wherein the production component includes a TEG.

2. The method according to claim 1, wherein said information regarding said other components includes information regarding marks arranged on said single wafer.

3. The method according to claim 1, wherein the calculated manufacturing data is displayed on a display device.

4. The-method according to claim 1, wherein said step of simulating a layout of said plurality of LSI chips and other components on said single wafer is repeated if the layout of said plurality of LSI chips and said other components is judged to not fit on said single wafer and the set size of said LSI chip is changed as a result thereof.

5. The method according to claim 1, wherein said steps of simulating a layout of said plurality of LSI chips and other components on said single wafer and calculating manufacturing data for said single wafer are repeated if the layout of said plurality of LSI chips and said other components is judged to not fit on said single wafer and the set size of said LSI chip is changed as a result thereof.

6. The method according to claim 1, wherein the set size of said LSI chip is set after determining a wiring arrangement on said LSI chip.

7. The method according to claim 1, wherein the TEG is mounted on a chip.

8. The method according to claim 1, wherein the production component is mounted on a chip.

9. A method of manufacturing a plurality of LSI chips on a single wafer, said method comprising:
   setting a size of one of said LSI chips;
   simulating a layout of said plurality of LSI chips and other components on said single wafer based on the set size of said one of said LSI chips and information regarding said other components, wherein said other components include a production component for use during LSI chip production and having no function for operation of a finished LSI chip;
   judging whether the simulated layout of said plurality of LSI chips and other components fits on said single wafer;
   calculating a LSI chip yield per said single wafer if the simulated layout of said plurality of said LSI chips and said other components is judged to fit on said single wafer;
   judging by a designer whether the calculated LSI chip yield per single wafer satisfies predetermined acceptable LSI chip yield per single wafer of the designer; and
   designing a mask for said plurality of LSI chips and said other components on said single wafer if the calculated LSI chip yield per single wafer satisfies the predetermined acceptable LSI chip yield per single wafer,
   wherein said plurality of LSI chips are manufactured for use in accordance with the designed mask, and
   wherein the production component includes a TEG.

10. The method according to claim 9, wherein said information regarding said other components includes information regarding marks arranged on said single wafer.

11. The method according to claim 9, wherein the calculated LSI chip yield is displayed on a display device.

12. The method according to claim 9, wherein said step of simulating a layout of said plurality of LSI chips and other components on a single wafer is repeated if the layout of said plurality of LSI chips and said other components is judged to not fit on said single wafer and the set size of said LSI chip is changed as a result thereof.

13. The method-according to claim 9, wherein said steps of simulating a layout of said plurality of LSI chips and other components on a single wafer and calculating an LSI chip yield for said single wafer are repeated if the layout of said plurality of LSI chips and said other components is judged to not fit on the single wafer and the set size of said LSI chip is changed as a result thereof.

14. The method according to claim 9, wherein the TEG is mounted on a chip.

15. The method according to claim 9, wherein the production component is mounted on a chip.

16. A method of manufacturing a plurality of LSI chips on a single wafer, said method including:
   setting a size of one of said LSI chips;
   simulating a layout of said plurality of LSI chips and other components on said single wafer based on the set size of said one of said LSI chips and information regarding said other components, wherein said other components include a production component for use during LSI chip production and having no function for operation of a finished LSI chip;

judging whether the simulated layout of said plurality of LSI chips and other components fits on said single wafer;

calculating a manufacturing cost for said single wafer if the simulated layout of said plurality of said LSI chips and said other components is judged to fit on said single wafer;

judging by a designer whether the calculated manufacturing cost for said single wafer satisfies predetermined acceptable manufacturing cost for said single wafer of the designer; and designing a mask for said plurality of LSI chips and said other components on said single wafer if the calculated manufacturing cost for said single wafer satisfies the predetermined acceptable manufacturing cost for said single wafer, wherein said plurality of LSI chips are manufactured for use in accordance with the designed mask, and wherein the production component includes a TEG.

17. The method according to claim 16, wherein said information regarding said other components includes information regarding marks arranged on said single wafer.

18. The method according to claim 16, wherein the calculated manufacturing cost is displayed on a display device.

19. The method according to claim 16, wherein said step of simulating a layout of said plurality of LSI chips and other components on a single wafer is repeated if the layout of said plurality of LSI chips and said other components is judged to not fit on the single wafer and the set size of said LSI chip is changed as a result thereof.

20. The method according to claim 16, wherein said steps of simulating a layout of said plurality of LSI chips and other components on a single wafer and calculating a manufacturing cost for said single wafer are repeated if the layout of said plurality of LSI chips and said other components is judged to not fit on the single wafer and the set size of said LSI chip is changed as a result of the calculated manufacturing cost.

21. The method according to claim 16, wherein said size of a LSI chip is set after determining a wiring arrangement on said LSI chip.

22. The method according to claim 16, wherein the TEG is mounted on a chip.

23. The method according to claim 16, wherein the production component is mounted on a chip.

* * * * *